US007476877B2

United States Patent
Low et al.

(10) Patent No.: US 7,476,877 B2
(45) Date of Patent: Jan. 13, 2009

(54) WAFER CHARGE MONITORING

(75) Inventors: Russell J. Low, Rowley, MA (US);
George M. Gammel, Marblehead, MA (US); Peter F. Kurunczi, Somerville, MA (US); Eric Cobb, Danvers, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 106 days.

(21) Appl. No.: 11/353,820

(22) Filed: Feb. 14, 2006

(65) Prior Publication Data

US 2007/0187615 A1   Aug. 16, 2007

(51) Int. Cl.
*H01J 37/30* (2006.01)
(52) U.S. Cl. .................. 250/492.21; 250/397
(58) Field of Classification Search ............ 250/492.21, 250/397, 492.23, 492.2, 492.1
See application file for complete search history.

(56) References Cited

U.S. PATENT DOCUMENTS

| 4,675,530 | A |   | 6/1987  | Rose et al.         |
| 4,825,087 | A |   | 4/1989  | Renau et al.        |
| 4,904,902 | A | * | 2/1990  | Tamai et al. ............ 315/111.81 |
| 6,489,792 | B1 |  | 12/2002 | Sakai                |
| 6,894,474 | B2 |  | 5/2005  | Cox et al.          |
| 6,943,568 | B2 |  | 9/2005  | Maeno                |
| 2004/0189329 | A1 |   | 9/2004 | Maeno               |
| 2005/0133737 | A1 | * | 6/2005 | Keum et al. ............ 250/492.21 |
| 2005/0162175 | A1 |   | 7/2005 | Maeno               |

FOREIGN PATENT DOCUMENTS

| EP | 0 966 020 | 12/1999 |
| WO | WO 02/052612 | 7/2002 |

OTHER PUBLICATIONS

M.E. Mack et al., Progress in Wafer Charging and Charge Neutralization, NIM B (1993), pp. 287-290.
D.L. Smatlack et al., Charge Neutralization in Ion Implanters, NIM B (1995), pp. 22-29.

* cited by examiner

*Primary Examiner*—Nikita Wells
*Assistant Examiner*—Johnnie L Smith, II

(57) ABSTRACT

A charge monitoring system may include a platen having a surface configured to accept a wafer thereon, and a charge monitor disposed relative to the platen so that an ion beam simultaneously strikes a portion of the charge monitor and a portion of the wafer. The charge monitor is configured to provide a charge monitor signal representative of a charge on a surface of the wafer when the ion beam simultaneously strikes the portion of the charge monitor and the portion of the wafer. The charge monitor signal may depend, at least in part, on a beam potential of the ion beam.

20 Claims, 7 Drawing Sheets

WAFER CHARGE MONITORING

FIELD OF THE INVENTION

This invention relates to systems and methods for ion implantation and, more particularly, to methods and apparatus for monitoring wafer charge during ion implantation.

BACKGROUND OF THE INVENTION

Ion implantation is a standard technique for introducing conductivity-altering impurities into semiconductor wafers. A desired impurity material may be ionized in an ion source, the ions may be accelerated to form an ion beam of prescribed energy, and the ion beam may be directed at a surface of the wafer. The energetic ions in the beam penetrate into the bulk of the semiconductor material and are embedded into the crystalline lattice of the semiconductor material to form a region of desired conductivity. The ion beam may be distributed over the wafer area by beam scanning, by wafer movement or by a combination of beam scanning and wafer movement. The energetic ions in the ion beam are charged particles. Hence, in some instances the front surface of the wafer may accumulate an excessive charge that may lead to damage of the devices on the wafer.

One cause of excessive charge accumulation may be insufficient electrical contact of platen grounding pins due to improper installation, damage, wear, contamination, or an oxide or other insulting layer on the rear surface of the wafer. The platen grounding pins should normally contact the rear surface of the wafer when the wafer is properly supported by the platen in order to provide a path to ground for charge neutralization. Another cause of excessive charge accumulation may be the non-use or insufficient use of an electron supply source when a positive charge accumulates on the wafer. The electron supply source, e.g., a plasma flood gun (PFG), may supply low energy electrons to neutralize an accumulated positive charge on the wafer. In addition, isolated areas on the front surface of the wafer, e.g., an oxide layer, that do not allow charge to dissipate through the wafer substrate may cause charge accumulation.

Hence, wafer charge monitoring techniques for monitoring charge accumulation have been developed. One conventional approach utilizes a measuring electrode disposed in a substrate-holding unit that is not directly exposed to the ion beam. Yet another conventional approach utilizes a charge-receiving conductor disposed on a front surface of a rotating wafer disk that supports a plurality of wafers. The charge-receiving conductor is coupled to another conductor disposed on the rear surface of the rotating wafer disk. The conductor on the rear surface of the rotating wafer disk is then capacitively coupled to yet another conductor fixed to a disk chamber. A drawback of this approach is that it requires a plurality of conductors and capacitive coupling of at least two of the conductors. In addition, this technique requires a spinning wafer disk for batch implantation, which is not suitable for single wafer ion implantation.

Accordingly, there is a need for new and improved methods and apparatus for monitoring charge accumulation on a wafer during ion implantation.

SUMMARY OF THE INVENTION

According to a first aspect of the invention, a charge monitoring system is provided. The charge monitoring system may include a platen having a surface configured to accept a wafer thereon, and a charge monitor disposed relative to the platen so that an ion beam simultaneously strikes a portion of the charge monitor and a portion of the wafer. The charge monitor is configured to provide a charge monitor signal representative of a charge on a surface of the wafer when the ion beam simultaneously strikes the portion of the charge monitor and the portion of the wafer.

According to another aspect of the invention, a method is provided. The method includes receiving an ion beam simultaneously on a portion of a wafer and a portion of a charge monitor, and providing a charge monitor signal representative of a charge on a surface of the wafer when the ion beam simultaneously strikes the portion of the charge monitor and the portion of the wafer.

According to yet another aspect of the invention, an ion implanter is provided. The ion implanter includes an ion beam generating system configured to provide an ion beam, a platen having a surface configured to accept a wafer thereon, and a charge monitor disposed relative to the platen so that the ion beam simultaneously strikes a portion of the charge monitor and a portion of the wafer. The charge monitor is configured to provide a charge monitor signal representative of a charge on a surface of the wafer when the ion beam simultaneously strikes the portion of the charge monitor and the portion of the wafer.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
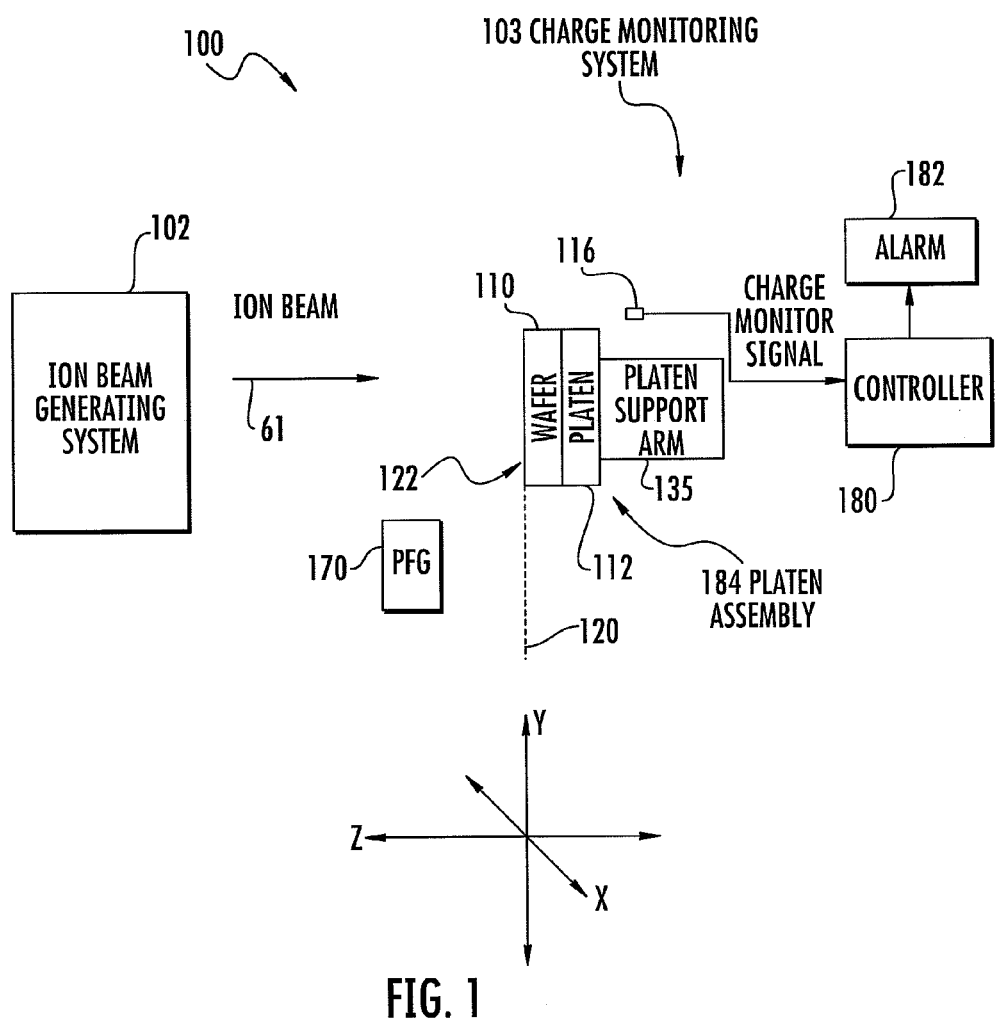
FIG. 1 is a simplified schematic diagram of an ion implanter including an ion beam generating system and a charge monitoring system in accordance with an embodiment of the invention.

FIG. 1 illustrates a block diagram of an ion implanter 100 including an ion beam generating system 102 and a charge monitoring system 103 consistent with an embodiment of the invention. The ion beam generating system 102 may generate an ion beam 61 directed towards a front surface 122 of a wafer 110. The ion beam 61 may be of a particular ion species and may be a spot beam or a ribbon beam. The ion beam 61 may be distributed over the wafer area by beam scanning, by wafer movement or by a combination of beam scanning and wafer movement. The spot beam may be stationary or it may be scanned.

The charge monitoring system 103 may generally include a platen 112 and a charge monitor 116. The platen 112 may have a surface configured to accept the wafer 110. The charge monitor 116 may be disposed relative to the platen 112 so that an ion beam 61 simultaneously strikes a portion of the charge monitor 116 and a portion of the wafer 110 during ion implantation. The charge monitor 116 may further be configured to provide a charge monitor signal representative of a charge on the front surface 122 of the wafer 110. The charge monitor signal may be representative of a charge on the front surface 122 of the wafer 110 when the ion beam 61 simultaneously strikes the portion of the charge monitor and the portion of the wafer 110. The charge monitor signal may depend, at least in part, on a beam potential on a beam axis of the ion beam 61.

The charge monitoring system 103 may further include a platen support arm 135, a controller 180, and an alarm 182. The support arm 135 may support the platen 112 and may be part of a platen assembly 184 that provides for translation of the platen relative to the ion beam 61 in a variety of directions. To assist with direction, it is helpful to define a coordinate system wherein the origin is at the center of the wafer 110 positioned for ion implantation. In this position, the wafer defines a wafer plane 120, the X-axis is horizontal and in the wafer plane 120, the Y-axis is vertical and in the wafer plane 120, and the Z-axis is perpendicular to the wafer plane 120. In one instance, the platen arm 135 may translate the platen 112 in the vertical Y-axis direction as the ion beam 61 is directed to the wafer 110.

The charge monitor 116 may be disposed relative to the platen 112 so that an ion beam 61 simultaneously strikes a portion of the charge monitor 116 and a portion of the wafer 110 during ion implantation. To accomplish this, the charge monitor 116 may be affixed to various locations. In one embodiment, the charge monitor 116 may be fixed to a portion of an end station or some other structure, and the platen 112 may be configured to move relative to the charge monitor 116. In other embodiments, the charge monitor 116 may move with the moving platen 112. In this instance, the charge monitor 116 may be coupled to a mounting bracket that may be affixed to a rear portion of the platen 112 or the platen support arm 135, etc.

The controller 180 may accept the charge monitor signal as well as other signals and store and/or process the charge monitor signal. The controller 180 may control a variety of subsystems and components of the ion implanter 100. The controller may be implemented in hardware and/or software. The controller 180 may compare the charge on the surface of the wafer 110 with predetermined criteria to determine if there is an excessive charge on the wafer 110. If the charge monitor signal is representative of an excessive charge on the surface 122 of the wafer 110, the controller 180 may take corrective action. This corrective action may include a retuning of ion implantation system to reduce charge accumulation, e.g., could include a reduction in the ion beam current. This corrective action may also include a stopping of ion implantation and/or activating an alarm 182, e.g., an audio alarm or a visual alarm, to alert operating personnel.

An electron source such as the PFG 170 may be disposed proximate the wafer 110 to provide low energy electrons to neutralize a positive charge accumulation on the front surface 122 of the wafer 110. The PFG 170 may be disposed vertically upstream from the wafer 110 in the Z-axis direction.

Figure 2:
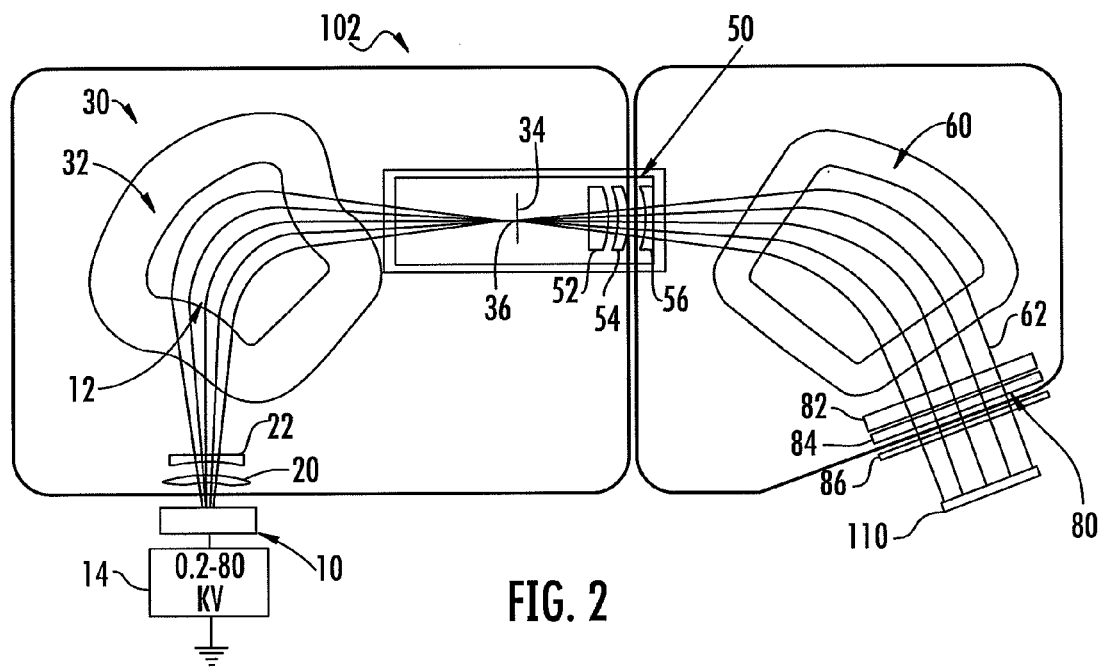
FIG. 2 is a block diagram of one embodiment of the ion beam generating system of FIG. 1.

Turning to FIG. 2, a block diagram of one embodiment of the ion beam generating system 102 of FIG. 1 is illustrated. Many other ion beam generating system 102 embodiments will be known to those skilled in the art and the embodiment of FIG. 2 is provided by way of example only and is not intended to be limiting. The ion beam generating system embodiment of FIG. 2 may generate a ribbon beam 62, while other embodiments may generate a spot beam. The spot beam may be a fixed spot beam with the ion beam distributed over the wafer by movement of the wafer. Beam scanning may also scan the spot beam over the wafer. Differing ion beam generating systems 102 may have, among other items, differing energy ranges and beam current ranges.

The ion beam generating system 102 of FIG. 2 may include an ion source 10, a mass analyzer 30, and an angle corrector magnet 60. The ion source 10 may generate ions and supply a source ion beam 12. The ion source 10 may include an ion chamber and a gas box containing a gas to be ionized. The gas is supplied to the ion chamber where it is ionized. The ions thus formed are extracted from the ion chamber to form a source ion beam 12. The source ion beam 12 may be directed between the poles of a resolving magnet 32. A first power supply 14 may be connected to an extraction electrode of the ion source 10 and provide a positive first voltage $V_0$. The first voltage $V_0$ may be adjustable, for example, from about 0.2 to 80 kV. Thus, ions from the ion source 10 may be accelerated to energies of about 0.2 to 80 keV by the first voltage $V_0$. Other embodiments may have ions from the ion source accelerated to energies of about 1 to 900 keV and from about 10 to 3,000 keV.

The source ion beam 12 may pass through a suppression electrode 20 and a ground electrode 22 to the mass analyzer 30. The mass analyzer 30 may include the resolving magnet 32 and a masking electrode 34 having a resolving aperture 36. The resolving magnet 32 may deflect ions in the source ion beam 12 such that ions of a desired ion species pass through the resolving aperture 36 and undesired ion species do not pass through the resolving aperture 36 but are blocked by the masking electrode 34. In one embodiment, the resolving magnet 32 deflects ions of the desired species by 90°.

Ions of the desired ion species of the ion beam may pass through resolving aperture 36 to a first deceleration stage 50 positioned downstream of the mass analyzer 30. The deceleration stage 50 may include an upstream electrode 52, a suppression electrode 54, and a downstream electrode 56. Ions in the source ion beam may be decelerated by the deceleration stage 50 and then pass through an angle corrector magnet 60. The angle corrector magnet 60 may deflect ions of the desired ion species and convert the ion beam from a diverging ion beam to a ribbon ion beam 62 having substantially parallel ion trajectories. In one embodiment, the angle corrector magnet 60 may deflects ions of the desired ion species by 70°.

The ribbon ion beam 62 may have a large width/height aspect ratio. The ribbon ion beam 62 may be delivered to the wafer 110 and the wafer 110 may be moved perpendicular to the long dimension of the ribbon beam 62 cross-section to distribute the ion beam over the surface 122 of the wafer 110. The ribbon ion beam 62 may be at least as wide as the wafer 110. The ion beam generating system 102 may further include a second deceleration stage 80 positioned downstream of the angle corrector magnet 60. The deceleration stage 80 may include an upstream electrode 80, a suppression electrode 84, and a downstream electrode 86.

Figure 3:
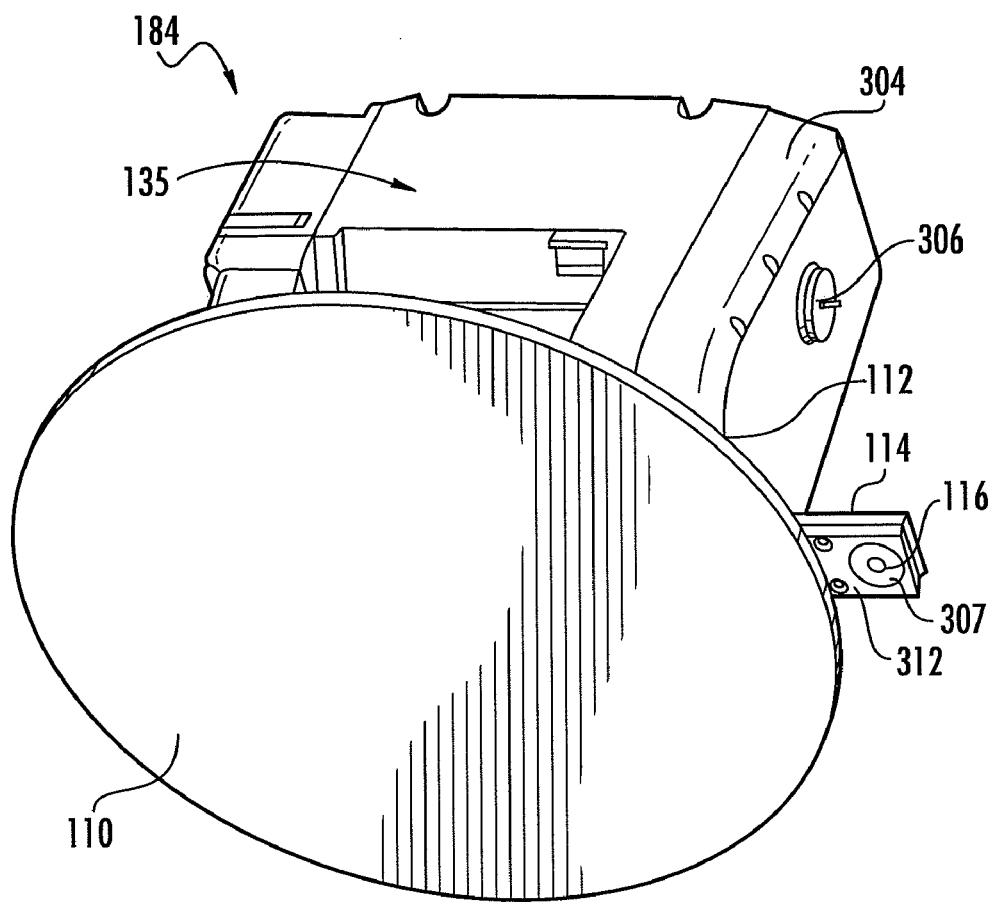
FIG. 3 is a perspective view of one embodiment of the platen assembly of FIG. 1.

FIG. 3 illustrates a perspective view of one embodiment of the platen assembly 184 of FIG. 1. The platen assembly 184 may include a platen support arm 135 to support the platen 112. The platen support arm 135 may include a cover 304 having a feed-through opening 306. The feed-through opening 306 may provide an opening for conductors to pass to and from the platen assembly 184.

In this embodiment, the platen assembly 184 may also include a mounting bracket 114 to dispose the charge monitor 116 relative to the platen 112. The mounting bracket 114 may be affixed to a rear portion of the platen 112 or a portion of the platen support arm 135 or any other structure of the platen assembly 184 so that the charge monitor 116 moves with the platen 112. In other embodiments, the charge monitor 116 may be fixed to a stationary structure, e.g., to a portion of an end station or other structure, so that the charge monitor 116 remains stationary and the platen 112 may move relative to the stationary charge monitor 116.

The charge monitor 116 may be fabricated of conductive material such as graphite. In one embodiment, the charge monitor 116 may have a circular planar surface exposed to the ion beam. An optional insulating disk 307 of insulating material may be disposed about the circumference of the charge monitor 116 to insulate the charge monitor 116. A mounting plate 312 may also be mounted to the mounting bracket 114. The mounting plate 312 may also be fabricated of graphite. A wafer 110 may be placed on the platen 112 by automated wafer handling equipment. The wafer 110 may have a diameter, e.g., 300 millimeters in one embodiment, substantially equal to the diameter of the platen 112. The charge monitor 116 may be disposed relative to the surface of the platen 112 so that during implant an ion beam simultaneously strikes a portion of the charge monitor 116 and a portion of the wafer disposed on a surface of the wafer 110.

Figure 4:
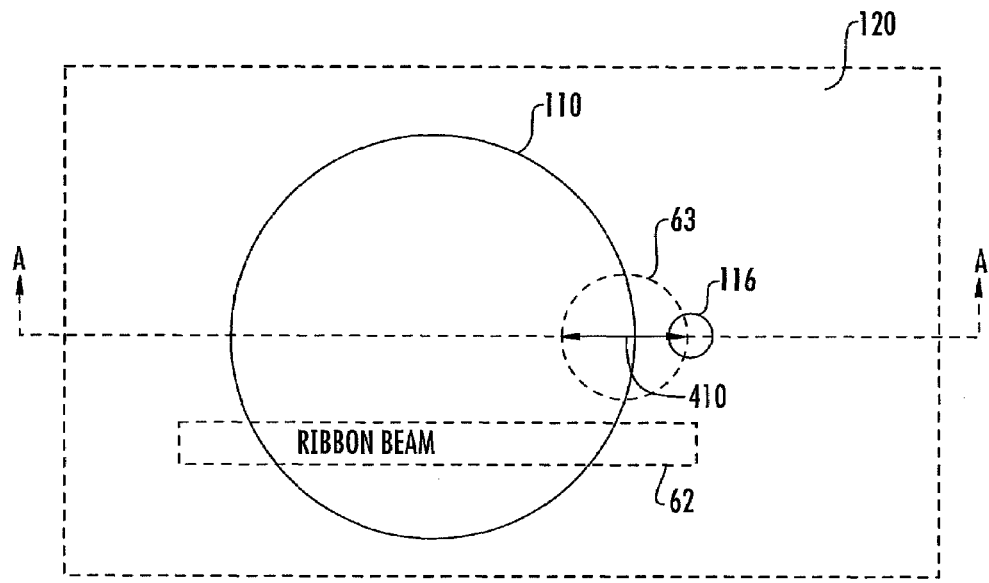
FIG. 4 is a front view of the platen assembly of FIG. 3 having a wafer disposed on a surface of the platen.
Figure 5:
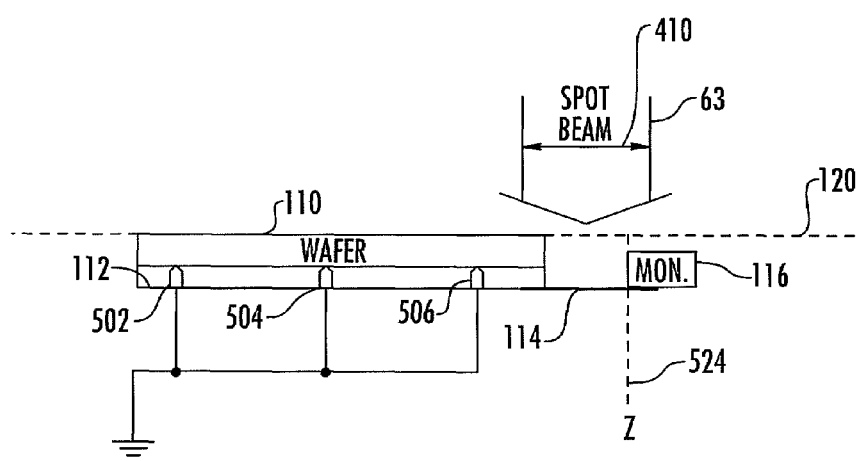
FIG. 5 is cross-sectional view taken along line A-A of FIG. 4.

FIG. 4 is a front view of the platen assembly of FIG. 3 as seen by the ion beam 61. FIG. 5 is a cross-sectional view of the same taken along the line A-A of FIG. 4. A plurality of platen grounding pins 502, 504, 506 that may be electrically coupled to the rear surface of the wafer 110 when the wafer 110 is clamped to the platen 112 are illustrated in FIG. 5. The wafer 110 may be clamped to the platen using known techniques such as electrostatic wafer clamping where the wafer is clamped to the platen with electrostatic forces or mechanical clamping where the wafer is clamped to the platen with mechanical forces.

The charge monitor 116 may be disposed relative to the platen 112 so that an ion beam simultaneously strikes a portion of the charge monitor 116 and a portion of the wafer 110 disposed on a surface of the platen 112. The ion beam 61 may be a spot beam 63 or a ribbon beam 62 as illustrated in phantom in FIG. 4. The spot beam 63 may be stationary or scanned across the surface of the wafer 110. The spot beam 63 may have an approximately circular cross-section of a particular diameter 410 depending on the characteristics of the spot beam 63. In one embodiment, the spot beam may have a diameter of about 30 mm. The ribbon beam 62 may have a large width/height aspect ratio.

The wafer 110 to be implanted may define a planar surface 120. The charge monitor 116 may be disposed within a lateral distance from an edge of the wafer 110 in a direction defined by the planar surface 120. In one embodiment, the lateral distance may be less than or equal to the diameter 410 of the spot beam 63 to be applied to the wafer 110 for a particular application. Despite being disposed within this lateral distance from an edge of the wafer 110 in a direction defined by the planar surface 120, the charge monitor 116 may be disposed any distance longitudinally from the planar surface 120 in the Z-axis direction 524 as long as there is no interference with the ion beam before encountering the charge monitor 116. For example, the charge monitor 116 may be disposed within a lateral distance less than or equal to the diameter 412 of the spot beam 63, but may be located downstream in the Z-axis direction 524 from the planar surface 120 a distance larger than the diameter 412 of the spot beam 63.

Figure 6:
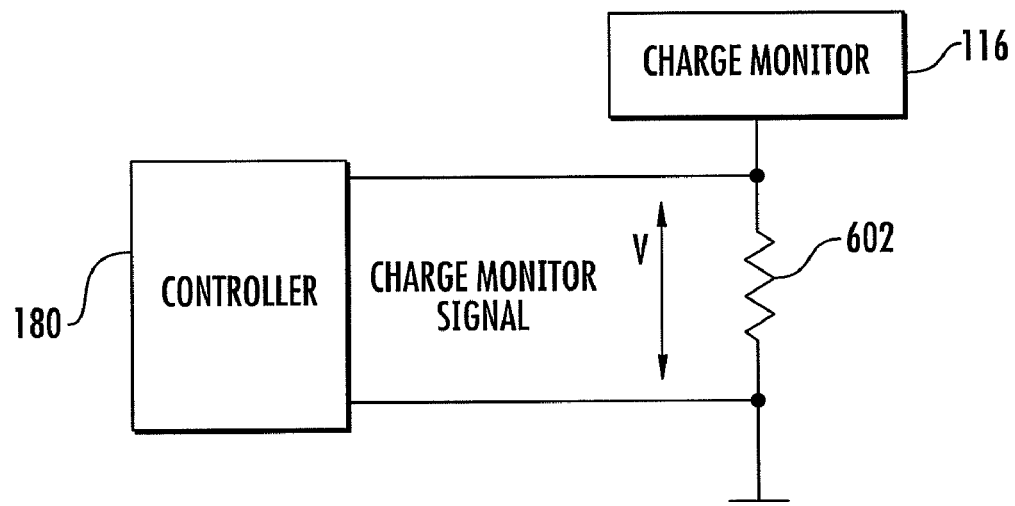
FIG. 6 is a diagram of an embodiment of the charge monitoring system of FIG. 1.

FIG. 6 is a block diagram illustrating one embodiment for providing a charge monitor signal from the charge monitor 116 to the controller 180. As illustrated, the charge monitor 116 may be coupled in series to a resistor 602 and then to ground. In one embodiment, the resistor 602 may be greater than or equal to about 100 kilo-ohms (kΩ). The voltage drop V across the resistor 602 may be the charge monitor signal. The charge monitor signal may be provided to the controller 180 for processing.

The charge monitor signal, e.g., the voltage drop across the resistor 602 in one embodiment, may be a function of the measured floating potential sensed by the charge monitor 116. Therefore, the charge monitor signal may depend, at least in part, on the beam potential of the ion beam 61.

Figure 7:
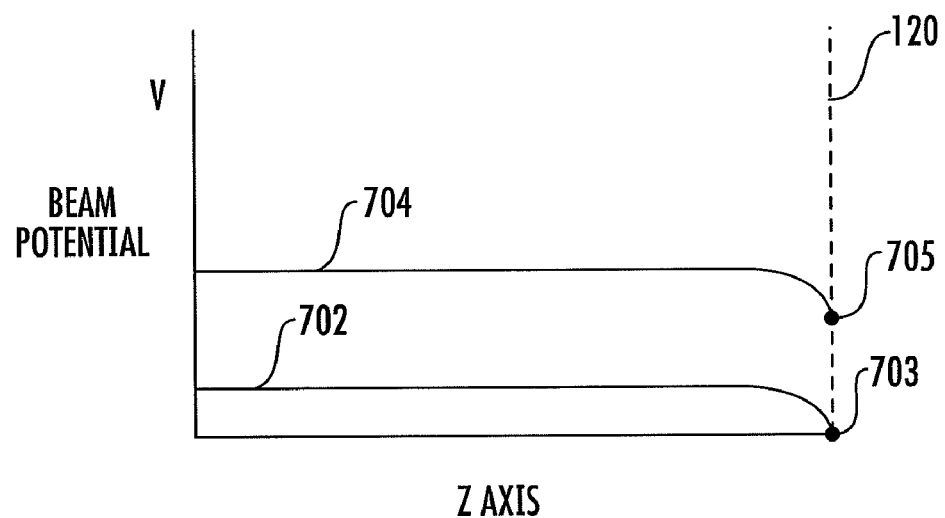
FIG. 7 illustrates plots of beam potential along a beam axis that vary as a function of charge on a surface of the wafer.

Turning to FIG. 7, plots 702, 704 of beam potential on the beam axis of the ion beam 61 for varying levels of charge built up on the front surface of the wafer 110 at the planar surface 120 are illustrated. The vertical axis of the graph represents beam potential in volts and the horizontal axis represents distance from the planar surface 120 defined by the front surface of the wafer 110 to be implanted with the ion beam 61.

Plot 702 illustrates the beam potential in volts on a beam axis of the ion beam 61 directed to a wafer 110 having about zero potential at the front surface of the wafer. Accordingly, plot 702 terminates at point 703 close to zero volts. The charge monitor signal associated with such a plot 702 may have a first peak voltage level. In contrast, plot 704 illustrates the beam potential directed to the surface of a wafer 110 having an accumulated charge. Accordingly, plot 704 terminates at point 705 comparatively greater than point 703 and has a larger voltage level then plot 702 further away from the plane 120 on the beam axis. Accordingly, the charge monitor signal associated with plot 704 may have a second peak voltage level greater than the first peak voltage level for plot 702. The difference between the first and second peak voltage levels may be representative of a charge on the front surface of the wafer 110. The charge monitor may therefore behave as a surface voltage monitor.

Figure 8:
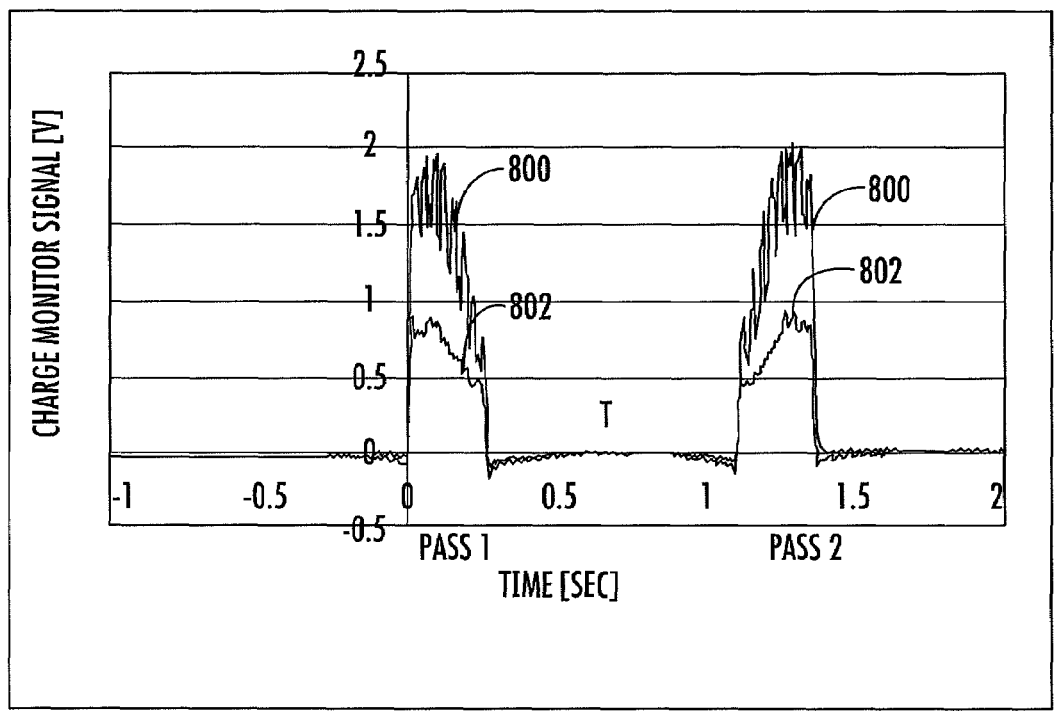
FIG. 8 illustrates plots of two different charge monitor signals.

FIG. 8 illustrates two plots 800 and 802 of two different charge monitor signals for two simulated separate conditions. For both plots 800 and 802 a separate neutralizing electron source such as the PFG 170 was turned off. The first plot 800 is a plot of the charge monitor signal for successive passes (passes 1 and 2) of the ion beam 61 relative to the charge monitor 116 with the platen grounding pins, e.g., pins 502, 504, 506 of FIG. 5, purposefully left floating. In contrast, the second plot 802 is a plot of the charge monitor signal for successive passes with the platen grounding pins properly grounded.

The charge monitor signals 800 and 802 may be analyzed to determine if an excessive charge is accumulating on the surface of the wafer 110 during ion implantation. To do this, the peak voltage of the monitoring signal during one pass may be compared to a first threshold. The difference between the peak voltage and the first threshold may be representative of the charge on the surface of the wafer 110. If this difference is greater than a second threshold, it may be representative of an excessive charge on the surface of the wafer.

For example, pass 1 of plot 800 has a peak voltage of about 1.9 V. Compared to a first threshold of about 0.8 V, a difference of 1.1 V is obtained. This 1.1 V difference may be greater than another threshold of, for example, 0.5 V, and therefore be indicative of an excessive charge on the surface of the wafer 110. In contrast, the peak amplitude of each pass 1-2 of plot 802 is about equal to the first threshold of 0.8 V providing a difference of about 0 V. This difference is less than the second threshold of 0.5 V in this example, and therefore indicative of an acceptable charge on the surface of the wafer 110.

The monitored voltage of the charge monitor signal may be affected by a separate neutralizing electron source such as the PFG 170. As is known in the art, a PFG 170 may provide electrons to neutralize positive charge build up on the surface of the wafer 110. The PFG 170 may include a filament driven by a variable PFG arc current to vary the quantity of electrons provided by the PFG 170. Accordingly, with all other conditions being equal, a higher PFG arc current will produce more electrons to neutralize the positive charge built up on the wafer 110 and hence the monitored voltage of the charge monitor signal may be reduced.

Figure 9:
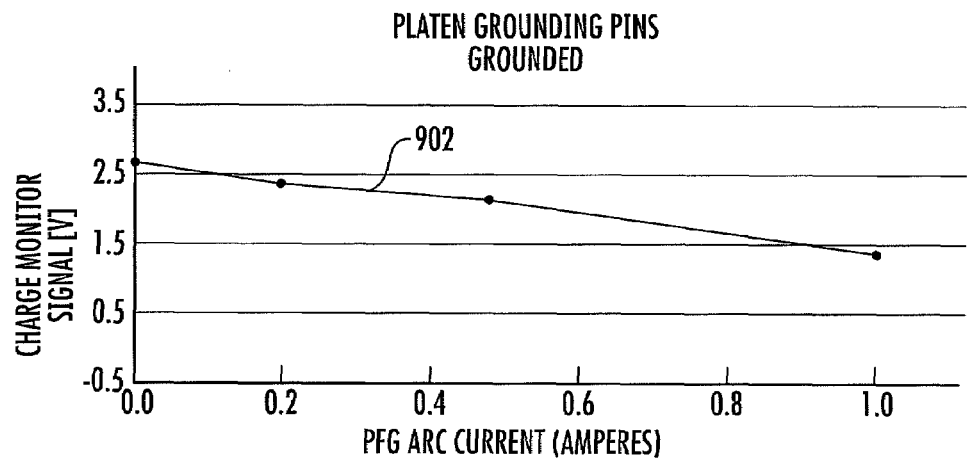
FIG. 9 is a plot of a charge monitor signal versus PFG arc current with platen grounding pins grounded.
Figure 10:
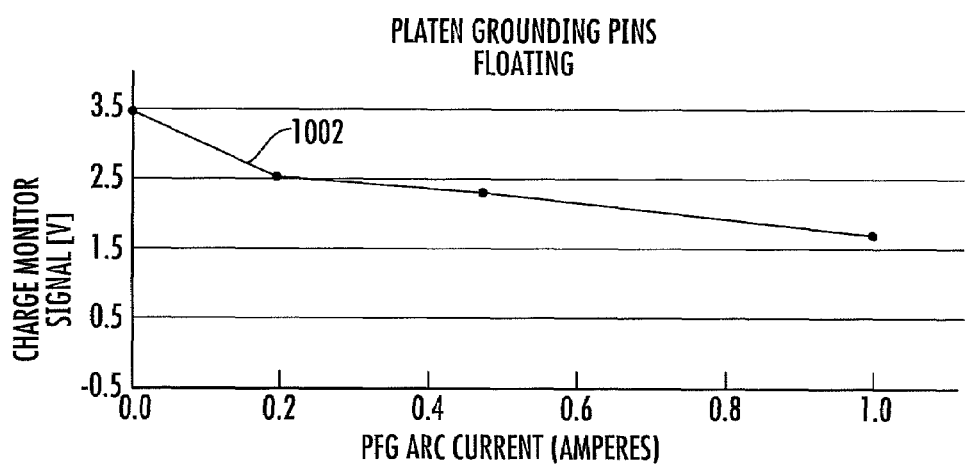
FIG. 10 is a plot of a charge monitor signal versus PFG arc current with platen grounding pins floating.

FIGS. 9 and 10 illustrate this affect of the PFG arc current of the PFG 170 on the monitored voltage of the charge monitor signal. FIG. 9 illustrates a plot 902 of the peak voltage during one pass of the ion beam 61 relative to the charge monitor 116 with varying PFG arc current levels with the platen grounding pins properly grounded. In contrast, FIG. 10 illustrates a plot 1002 of the peak voltage level during one pass of the ion beam with the platen grounding pins floating.

As illustrated, with the platen grounding pins grounded or floating, the peak voltage level of the charge monitor signal decreases with increasing PFG arc current levels. When the PFG is off (e.g., PFG arc current equals 0) the peak voltage level of the charge monitor signal is about 2.6 V with the platen grounding pins grounded (FIG. 9) and about 3.5 V with the platen grounding pins floating (FIG. 10). The elevated voltage level of the charge monitor signal, e.g., 3.5 V, may be compared to a first threshold, e.g., 2.5 V, to provide a difference, e.g., 1.1 V, representative of a charge on the wafer 110. If the difference, e.g., 1.1V, is greater than a second threshold, e.g., 0.5 V, then this may be representative of an excessive charge on the surface of the wafer 110.

As the PFG is turned on and the PFG arc current increases, the peak voltage levels of the charge monitor signal decrease as illustrated in FIG. 10. The reduced voltage levels of the charge monitor signal may be indicative of an acceptable charge since the PFG is sufficiently neutralizing the charge built up on the wafer 110.

Having thus described at least one illustrative embodiment of the invention, various alterations, modifications, and improvements will readily occur to those skilled in the art. Such alterations, modifications, and improvements are intended to be within and scope of the invention. Accordingly, the foregoing description is by way of example only and is not intended as limiting. The invention is limited only as defined in the following claims and the equivalents thereto.

What is claimed is:

1. A charge monitoring system comprising:
a platen having a surface configured to accept a wafer thereon; and
a charge monitor disposed relative to said platen so that an ion beam simultaneously strikes a portion of said charge monitor and a portion of said wafer, said charge monitor configured to provide a charge monitor signal representative of a charge on a surface of said wafer when said ion beam simultaneously strikes said portion of said charge monitor and said portion of said wafer.

2. The charge monitoring system of claim 1, wherein said charge monitor signal depends, at least in part, on a beam potential of said ion beam.

3. The charge monitoring system of claim 1, further comprising a resistor coupled to said charge monitor and to ground, wherein a voltage drop across said resistor is said charge monitor signal.

4. The charge monitoring system of claim 1, wherein said charge monitor signal has a peak voltage on a pass of said ion beam relative to said charge monitor, and wherein a difference between said peak voltage and a first threshold is representative of said charge on said surface of said wafer.

5. The charge monitoring system of claim 4, wherein said peak voltage is greater than said first threshold, and wherein said difference greater than a second threshold is representative of an excessive charge on said surface of said wafer.

6. The charge monitoring system of claim 1, wherein said ion beam comprises a spot beam, and wherein said wafer defines a planar surface, and wherein said charge monitor is disposed within a lateral distance from an edge of said wafer in a direction defined by said planar surface, said lateral distance less than or equal to a diameter of said spot beam.

7. The charge monitoring system of claim 6, wherein said diameter of said spot beam is about 30 millimeters.

8. The charge monitoring system of claim 6, wherein said spot beam is scanned across said wafer.

9. The charge monitoring system of claim 1, wherein said charge monitor comprises graphite.

10. The charge monitoring system of claim 9, wherein said charge monitor has a circular planar surface exposed to said ion beam.

11. The charge monitoring system of claim 1, wherein said charge monitor is fixed to a stationary structure so that said charge monitor remains stationary, and said platen is configured to move relative to charge monitor.

12. The charge monitoring system of claim 1, further comprising a mounting bracket coupled to said platen, said mounting bracket radially extending from an edge of said platen, wherein said charge monitor is mounted bracket.

13. A method comprising:
receiving an ion beam simultaneously on a portion of a wafer and a portion of a charge monitor; and
providing a charge monitor signal representative of a charge on a surface of said wafer when said ion beam simultaneously strikes said portion of said charge monitor and said portion of said wafer.

14. The method of claim 13, wherein said charge monitor signal depends, at least in part, on a beam potential on a beam axis of said ion beam.

15. The method of claim 13, wherein said charge monitor signal has a peak voltage on a pass of said ion beam, and wherein a difference between said peak voltage and a first threshold is representative of said charge on said surface of said wafer.

16. The method of claim 15, wherein said peak voltage is greater than said first threshold, and wherein said difference greater than a second threshold is representative of an excessive charge on said surface of said wafer.

17. The method of claim 13, wherein said ion beam comprises a spot beam, and wherein said wafer defines a planar surface, and wherein said charge monitor is disposed within a lateral distance from an edge of said wafer in a direction defined by said planar surface, said lateral distance less than or equal to a diameter of said spot beam.

18. The method of claim 17, wherein said diameter of said spot beam is about 30 millimeters.

19. An ion implanter comprising:
an ion beam generating system configured to provide an ion beam;
a platen having a surface configured to accept a wafer thereon; and
a charge monitor disposed relative to said platen so that said ion beam simultaneously strikes a portion of said charge monitor and a portion of said wafer, said charge monitor configured to provide a charge monitor signal representative of a charge on a surface of said wafer when said ion beam simultaneously strikes said portion of said charge monitor and said portion of said wafer.

20. The ion implanter of claim 19, wherein said ion beam generating system comprises an ion source configured to provide a source ion beam, and a resolving magnet configured to select a desired ion species from said source ion beam, said ion beam comprising said desired ion species.

* * * * *